(12) United States Patent
Caulfield

(10) Patent No.: US 10,842,048 B2
(45) Date of Patent: Nov. 17, 2020

(54) ELECTRICAL CABINET WITH VORTEX-ENTRAINED AIRFLOW

(71) Applicant: Eaton Intelligent Power Limited, Dublin (IE)

(72) Inventor: Donald Caulfield, Raleigh, NC (US)

(73) Assignee: Eaton Intelligent Power Limited (IE)

( * ) Notice: Subject to any disclaimer, the term of this patent is extended or adjusted under 35 U.S.C. 154(b) by 0 days.

(21) Appl. No.: 16/167,680

(22) Filed: Oct. 23, 2018

(65) Prior Publication Data

US 2019/0124794 A1 Apr. 25, 2019

Related U.S. Application Data

(60) Provisional application No. 62/575,724, filed on Oct. 23, 2017.

(51) Int. Cl.
*H05K 7/20* (2006.01)
*H02B 1/56* (2006.01)

(52) U.S. Cl.
CPC ......... *H05K 7/20545* (2013.01); *H02B 1/565* (2013.01); *H05K 7/20572* (2013.01)

(58) Field of Classification Search
CPC .............................. H01L 23/467; F28F 13/02
See application file for complete search history.

(56) References Cited

U.S. PATENT DOCUMENTS

| | | | | |
|---|---|---|---|---|
| 4,103,737 A | * | 8/1978 | Perkins | H01L 23/467 165/109.1 |
| 4,514,344 A | * | 4/1985 | Ruscheweyh | B01F 5/0473 261/109 |
| 7,510,471 B2 | * | 3/2009 | Lee | F15D 1/08 239/589.1 |
| 7,961,462 B2 | * | 6/2011 | Hernon | H05K 7/20145 165/109.1 |
| 8,049,587 B2 | * | 11/2011 | Israelsson Tampe | H01F 30/02 336/55 |
| 9,755,457 B2 | * | 9/2017 | Lee | H02J 9/061 |
| 2015/0380147 A1 | * | 12/2015 | Takano | H02M 1/126 333/185 |
| 2016/0037677 A1 | * | 2/2016 | Yamanaka | H05K 7/20918 361/697 |
| 2018/0210523 A1 | * | 7/2018 | Treffler | G06F 1/20 |

* cited by examiner

*Primary Examiner* — Mukundbhai G Patel
(74) *Attorney, Agent, or Firm* — Stanek Lemon Crouse & Meeks, P.A.

(57) ABSTRACT

An apparatus, such as a transformer cabinet, includes a housing (e.g., a sheet metal enclosure) having electrical equipment (e.g., a transformer) disposed therein. A duct in the housing is configured to direct a first airflow in the housing to create a vortex that entrains a second airflow that passes over the electrical equipment. The housing may have a first opening configured to provide the first airflow and a second opening configured to provide the second airflow. The first opening may be in a side wall of the housing and the second opening may be proximate a bottom of the housing. The side wall may include a first side wall and the duct may be configured to direct the first airflow upwards and towards a second side wall of the housing.

16 Claims, 5 Drawing Sheets ic # ELECTRICAL CABINET WITH VORTEX-ENTRAINED AIRFLOW

CROSS-REFERENCE TO RELATED APPLICATION

This U.S. nonprovisional application claims priority to U.S. Provisional Application No. 62/575,724, filed Oct. 23, 2017, in the U.S. Patent and Trademark Office, the entire contents of which is hereby incorporated herein by reference.

BACKGROUND

Embodiments of the inventive subject matter relate to electrical equipment cabinets and, more particularly, to airflow in electrical equipment cabinets.

Electrical components in cabinets or similar enclosures produce heat during operation. This heat typically must be removed or the electrical system may experience thermal failure. Some equipment cabinets, such as those housing transformers uninterruptible power supply (UPS) and other power distribution systems, often use passive convection techniques. For example, some transformer cabinets may have openings at their top and bottom, and rely on convection to pull air through the opening in the bottom of the cabinet such that it passes over the transformer and exhausts through the opening in the top of the cabinet. However, such passive convection systems may be inadequate due to relatively high inlet air temperatures and/or poor cabinet airflow, and may result in undesirably high internal cabinet temperatures and increased likelihood of thermal failure. Providing fans or other forced cooling systems to such a cabinet can be undesirable, as such systems can increase cost and complexity.

SUMMARY

Some embodiments provide an apparatus including a housing (e.g., a sheet metal enclosure) having electrical equipment (e.g., a transformer) disposed therein. A duct in the housing is configured to direct a first airflow in the housing to create a vortex that entrains a second airflow that passes over the electrical equipment. The housing may have a first opening configured to provide the first airflow and a second opening configured to provide the second airflow. The first opening may be in a side wall of the housing and the second opening may be proximate a bottom of the housing. The side wall may include a first side wall and the duct may be configured to direct the first airflow upwards and towards a second side wall of the housing.

In some embodiments, the duct may have a first surface inclined at an oblique angle with respect to the bottom of the housing and a second surface inclined at an oblique angle with respect to the first side wall. For example, the duct may include a first planar section oriented in a vertical plane and having a first edge attached to the first side wall of the housing and a second planar section having a first edge attached to the first side wall of the housing and a second edge joined to a second edge of the first planar section.

In some embodiments, a source external to the housing may provide the first airflow. For example, a fan in an adjacent cabinet that provides the first airflow.

Further embodiments of the inventive subject matter provide an electrical cabinet including a housing and a transformer disposed in the housing. The cabinet further includes a deflector in the housing proximate a first opening in the cabinet and configured to deflect an airflow passing through the first opening to create a vortex in the housing that entrains a second airflow that passes through a second opening in the cabinet and over the transformer. The first opening may be in a side wall of the housing and the second opening may be proximate a bottom of the housing.

Still further embodiments provide a cabinet including a housing having a first opening in a side wall of the housing and a second opening proximate a bottom of the housing. The cabinet further includes a deflector in the housing adjacent the first opening and including a first surface inclined at an oblique angle with respect to the bottom of the housing and a second surface inclined at an oblique angle with respect to the first side wall such that the deflector deflects a first airflow entering the first opening upwardly and toward a second side wall of the housing.

DETAILED DESCRIPTION

Figure 1:
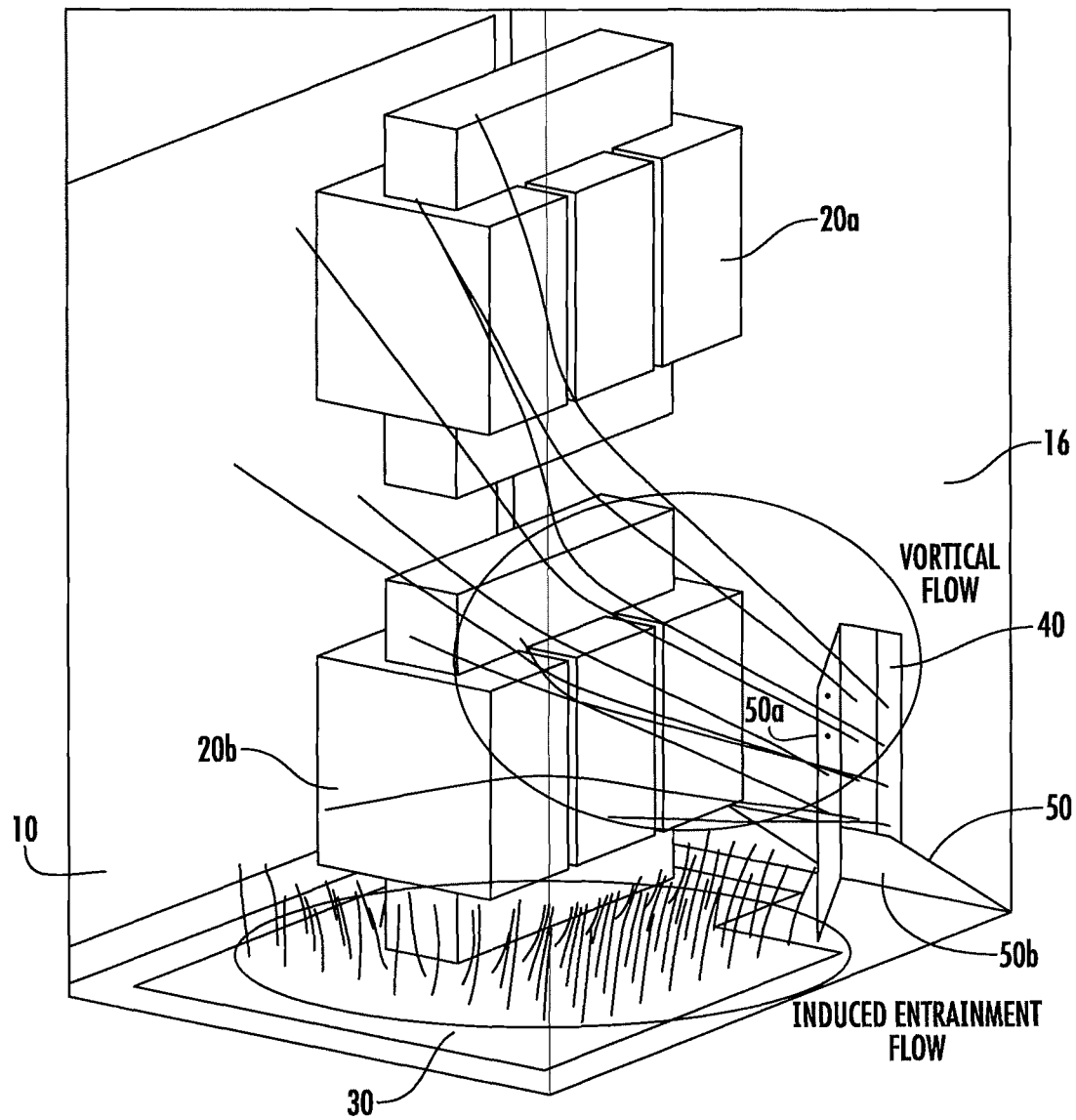
FIGS. 1-5 illustrate a cabinet that provides vortex-entrained airflow for electrical equipment according to some embodiments.
Figure 2:
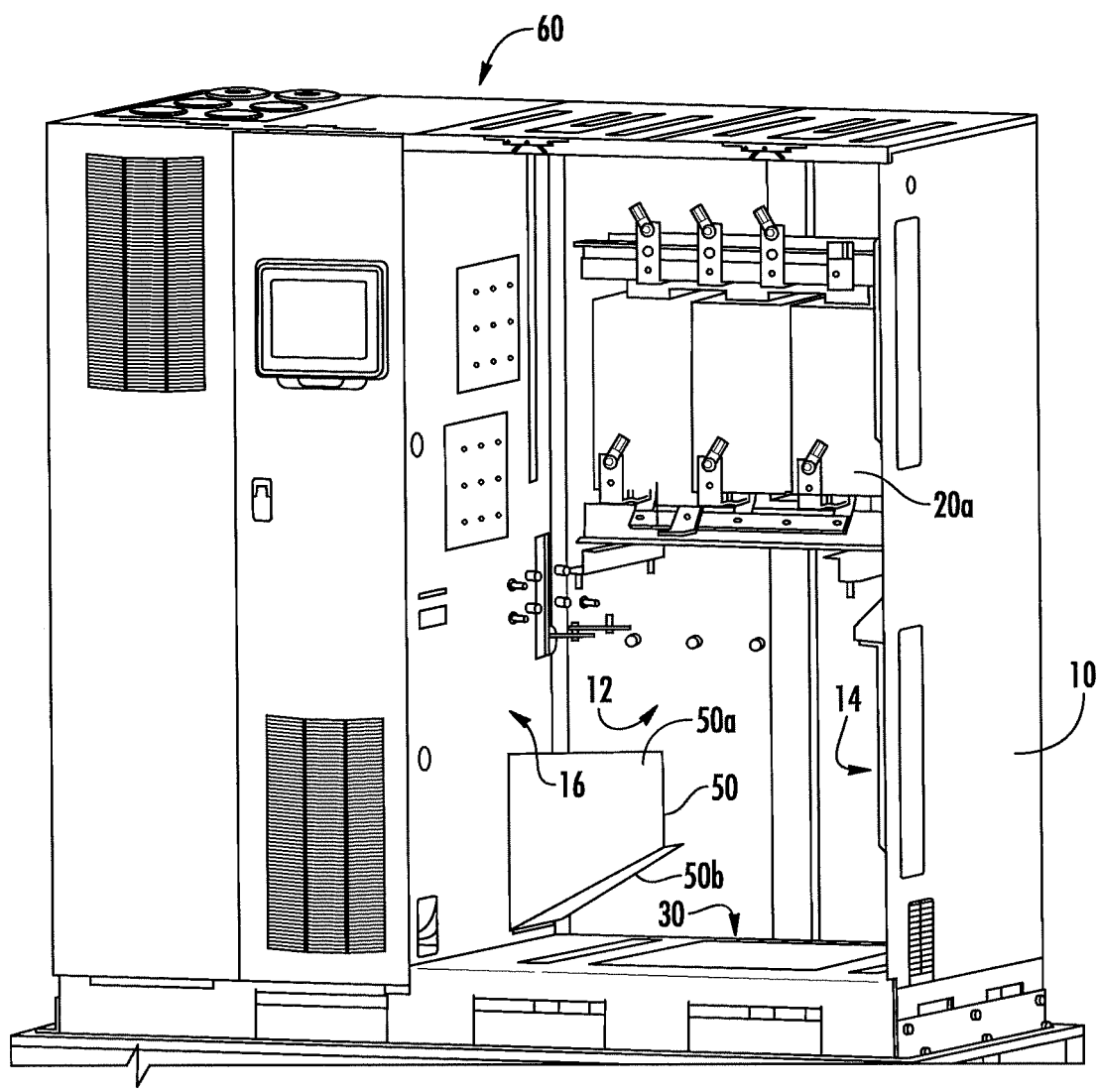

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Transformers that are used in uninterruptible power supply (UPS) systems are often housed in metal cabinets that are arranged in a row with other cabinets that house the core UPS converter components and cabinets that house ancillary components, such as power distribution units and static switches. Typically, the transformer cabinets (which may house one or more transformers) use natural (unforced) convection cooling, as it may be undesirable to house fans or other air moving equipment within the transformer cabinet. For example, a typical transformer cabinet will have grates or similar openings in its bottom and top walls that support airflow from below the transformer(s) and up through the cabinet.

Some embodiments of the inventive subject matter arise from a realization that some conventional transformer cabinet cooling systems may provide inadequate cooling due to insufficient airflow across the transformer(s). Some embodiments provide a transformer cabinet having a duct that conducts an airflow from outside of the cabinet through an opening in a sidewall of the cabinet to create a vortex that induces an entrained flow from an opening in a bottom or other portion of the cabinet, thus increasing the airflow over the transformer(s). In some embodiments, the duct may include first and second deflector surfaces that are configured to direct air upward and toward a wall of the cabinet, which can create the vortical flow. The duct may be fed by an airflow produced by a fan assembly located adjacent the sidewall of the transformer cabinet, such as a fan assembly housed in an adjacent cabinet.

FIGS. 1-5 illustrate a transformer cabinet arrangement according to some embodiments. A transformer cabinet includes a housing (enclosure) 10 that houses upper and lower transformer assemblies 20a, 20b. A vortex-inducing duct 50 supports an airflow through an opening 40 of a sidewall 16 of the housing 10 and directs this airflow upwards and towards a back wall 12 and an opposing sidewall 14 of the housing 10, thus creating a vortical flow within the housing 10. A grill 30 at a bottom of the cabinet supports an airflow from beneath the cabinet which is entrained by the vortex, thus producing improved flow upward across surfaces of the transformer assemblies 20a, 20b than would be the case if only convection were used to cool the transformers 20a, 20b. It will be appreciated that, in some embodiments, an entrained airflow could also come from openings or vents in a lower portion of one or more of the sidewalls (e.g., the back wall 12, an opposite facing front wall, and/or the sidewall 14) of the housing 10.

Figure 3:
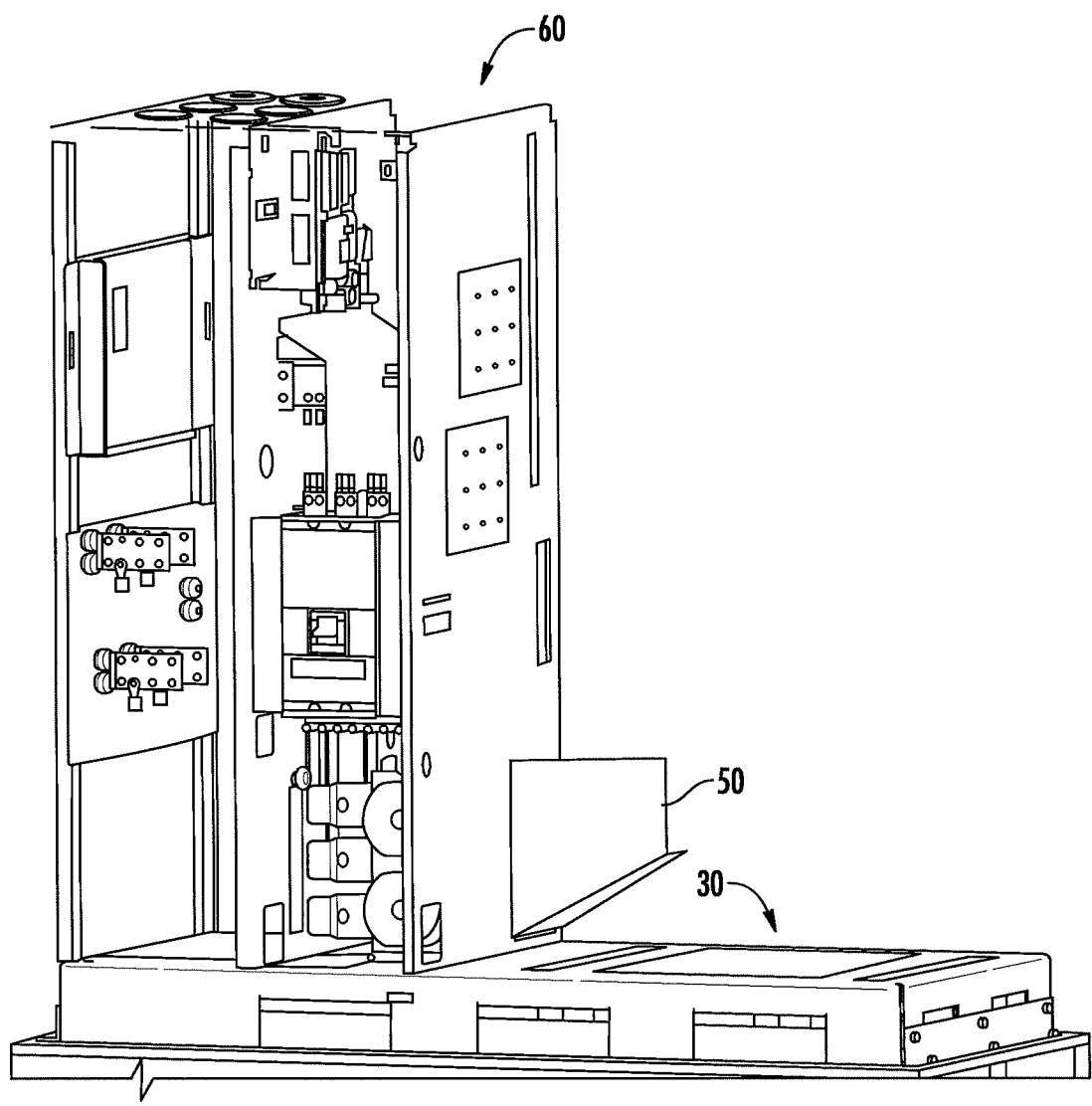

As shown in FIG. 3, the duct 50 has a first deflector surface 50a which acts to deflect the incoming airflow towards the back wall 12 of the housing 10 and a second deflector surface 50b which deflects the incoming air upward at an oblique angle with respect to the bottom of the housing 10. It will be appreciated that the configuration of the duct 50 shown is an example of a duct structure that can provide the desired vortical flow, and that other duct structures may be used to similar effect, such as round ducts that direct and airflow in a similar manner to produce a vortical flow within an electrical cabinet.

Figure 4:
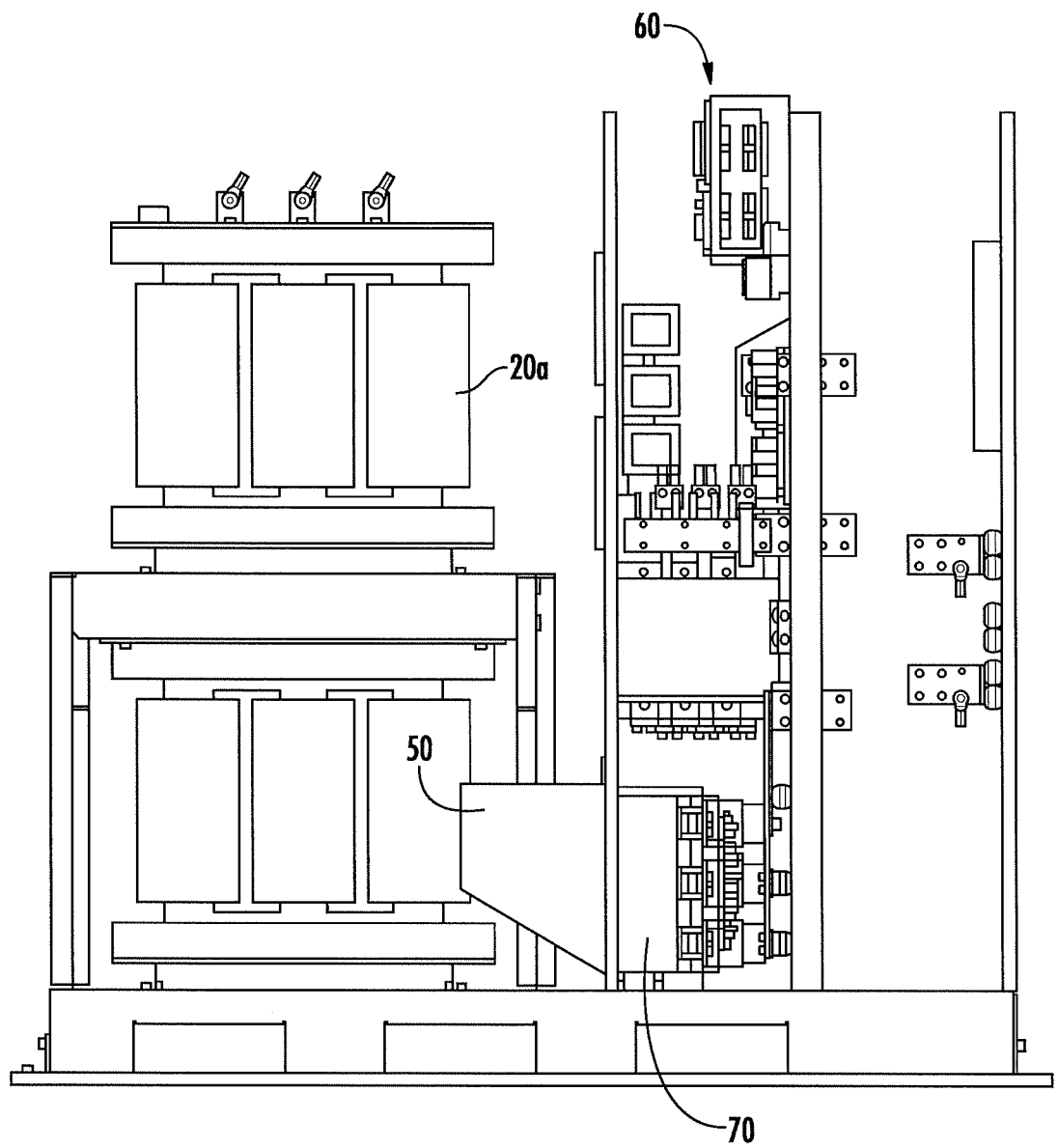
Figure 5:
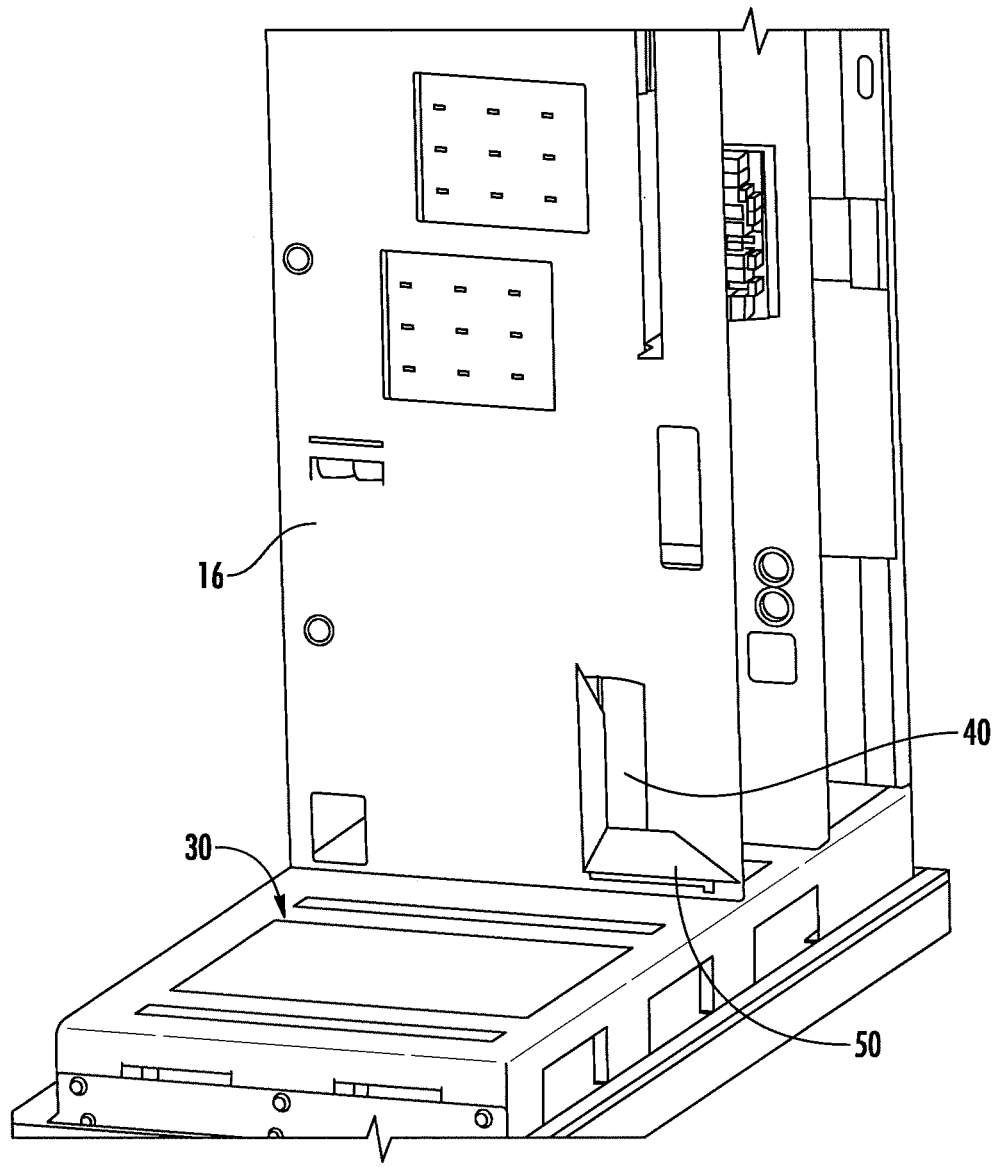

FIGS. 3 and 4 illustrate that the duct 50 may be fed from a source in an adjacent cabinet, here a fan 70 housed in a cabinet 60 that also houses a static bypass switch assembly. It will be appreciated, however, that the duct 50 could be supplied with an airflow using other means, such as from a supply duct fed from a non-adjacent source.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

The invention claimed is:

1. An apparatus comprising:
   a housing;
   electrical equipment disposed in the housing; and
   a duct in the housing configured to direct a first airflow in the housing to create a vortex that entrains a second airflow that passes over the electrical equipment,
   wherein the housing has a first opening in a side wall of the housing configured to provide the first airflow and a second opening proximate a bottom of the housing configured to provide the second airflow and wherein the duct is adjacent the first opening.

2. The apparatus of claim 1, wherein the side wall comprises a first side wall and wherein duct is configured to direct the first airflow upwards and towards a second side wall of the housing.

3. The apparatus of claim 2, wherein the duct has a first surface inclined at an oblique angle with respect to the bottom of the housing and a second surface inclined at an oblique angle with respect to the first side wall.

4. The apparatus of claim 2, wherein the duct comprises a first planar section oriented in a vertical plane and having a first edge attached to the first side wall of the housing and a second planar section having a first edge attached to the first side wall of the housing and a second edge joined to a second edge of the first planar section.

5. The apparatus of claim 1, wherein the first airflow is provided by a source external to the housing.

6. The apparatus of claim 1 in combination with an adjacent cabinet housing a fan that provides the first airflow.

7. The apparatus of claim 1, wherein the electrical equipment comprises a transformer.

8. An electrical cabinet comprising:
   a housing having first and second openings therein;
   a transformer disposed in the housing; and
   a deflector in the housing proximate the first opening and configured to deflect an airflow passing through the first opening to create a vortex in the housing that entrains a second airflow that passes through the second opening and over the transformer,
   wherein first opening is in a side wall of the housing and wherein the second opening is proximate a bottom of the housing.

9. The electrical cabinet of claim 8, wherein the side wall comprises a first side wall and wherein the deflector is configured to deflect the first airflow upwards and towards a second side wall of the housing.

10. The electrical cabinet of claim 9, wherein the deflector has a first surface inclined at an oblique angle with respect to the bottom of the housing and a second surface inclined at an oblique angle with respect to the first side wall.

11. The electrical cabinet of claim 10, wherein the deflector comprises a first planar section oriented in a vertical plane and having a first edge attached to the first side wall of the housing and second planar section having a first edge attached to the first side wall of the housing and a second edge joined to a second edge of the first planar section.

12. The electrical cabinet of claim 8, wherein the first airflow is provided by a source external to the housing.

13. The electrical cabinet of claim 12 in combination with another cabinet disposed adjacent the electrical cabinet and housing a fan that provides the first airflow.

14. A cabinet comprising:
   a housing having a first opening in a side wall of the housing and a second opening proximate a bottom of the housing; and a deflector in the housing adjacent the first opening and comprising a first surface inclined at an oblique angle with respect to the bottom of the housing and a second surface inclined at an oblique angle with respect to the first side wall such that the deflector deflects a first airflow entering the first opening upwardly and toward a second side wall of the housing, wherein the first airflow creates a vortex that entrains a second airflow entering the second opening.

15. The cabinet of claim 14, wherein the first opening is rectangular, wherein the deflector comprises a first planar section oriented in a vertical plane and having a first edge attached to the first side wall of the housing proximate a side of the first opening and second planar section having a first edge attached to the first side wall of the housing proximate a bottom of the first opening and a second edge joined to a second edge of the first planar section.

16. The cabinet of claim 14, further comprising a transformer in the housing, wherein the second airflow passes over the transformer.

\* \* \* \* \*